(12) United States Patent
Bumanlag et al.

(10) Patent No.: US 7,817,057 B2
(45) Date of Patent: Oct. 19, 2010

(54) WRIST STRAP MONITOR REMOTE ALARM PANEL DISPLAY

(75) Inventors: Napoleon B. Bumanlag, Laguna (PH); Roger Flores Galinggana, Jr., Laguna (PH); Lloyd Henry I. Li, Metro Manila (PH); Ray Nicanor M. Tag-At, Laguna (PH)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 203 days.

(21) Appl. No.: 11/998,667

(22) Filed: Nov. 30, 2007

(65) Prior Publication Data

US 2009/0140859 A1 Jun. 4, 2009

(51) Int. Cl.
G08B 23/00 (2006.01)
G08B 21/00 (2006.01)
H02H 1/00 (2006.01)
H01H 47/00 (2006.01)
G01R 31/00 (2006.01)
G01R 31/14 (2006.01)

(52) U.S. Cl. ............... 340/687; 340/573.1; 340/649; 340/660; 340/686.1; 361/212; 361/220; 324/500; 324/509

(58) Field of Classification Search ............ 340/686.1, 340/687, 649, 660, 586.2, 586.1, 573.1; 361/212–224; 324/500–509
See application file for complete search history.

(56) References Cited

U.S. PATENT DOCUMENTS

| 4,605,984 | A | 8/1986 | Fiedler |
| 4,649,374 | A | 3/1987 | Hoigaard |
| 5,057,965 | A * | 10/1991 | Wilson ................ 361/212 |
| 5,422,630 | A | 6/1995 | Quinn et al. |
| 5,519,384 | A * | 5/1996 | Chanudet et al. ......... 340/649 |
| 5,952,931 | A * | 9/1999 | Chotichanon et al. ....... 340/649 |
| 6,052,053 | A | 4/2000 | Jubin et al. |
| 6,150,945 | A | 11/2000 | Wilson |
| 6,205,408 | B1 * | 3/2001 | Jubin et al. .............. 702/182 |
| 6,930,612 | B1 * | 8/2005 | Kraz et al. ............... 340/649 |
| 7,085,120 | B2 | 8/2006 | Kraz et al. |

FOREIGN PATENT DOCUMENTS

| WO | WO 99/29143 | 6/1999 |
| WO | WO 00/00941 | 1/2000 |

OTHER PUBLICATIONS

Frank, Donald E., "Multi-Mount Continuous Monitor Operation, Installation, and Maintenance", ESD_Systems.com, (1981), 1-4.
Vinson, et al., "Electrostatic Discharge in Semiconductor Devices: Protection Techniques", *Proceedings of the IEEE*, vol. 88, No. 12, Dec. 2000, 1878-1900.

(Continued)

Primary Examiner—Benjamin C Lee
Assistant Examiner—Lam P Pham

(57) ABSTRACT

The present invention provides a remote alarm panel display for monitoring wrist-strap cords used by an operator to install components during the manufacturing of hard disk drives in order to provide grounding to the operator as the operator handles electrically sensitive components and also to provide mobility to the operator within the assembly floor. In one embodiment, the remote alarm panel display comprises a plurality of alarm indicators which are activated when a corresponding wrist strap is disconnected from a wrist strap monitoring device connected to the remote alarm panel display. In one embodiment the alarm indicators are light emitting diodes.

9 Claims, 5 Drawing Sheets

OTHER PUBLICATIONS

Gocemen, et al., "Evaluation of Wrist Strap Monitors from an MR Head Perspective", *EOS/ESD Symposium*, 4B.3.1-4B.3.10.

Spi, et al., "Ground Gard 4.5 Operation, Installation and Maintenance", *Desco Industries Inc.,* (2006),1-3.

\* cited by examiner

WRIST STRAP MONITOR REMOTE ALARM PANEL DISPLAY

TECHNICAL FIELD present invention relates generally to a method and a system for manufacturing and fabricating hard drive components in a manufacturing environment, and more particularly, to limiting electromagnetic interference and electrostatic discharge in hard drive components during manufacturing using an anti-static wrist strap monitor remote alarm panel display.

BACKGROUND ART

In many processing and computing systems, magnetic data storage devices, such as disk drives are utilized for storing data. A typical disk drive includes a spindle motor having a rotor for rotating one or more data disks having data storage surfaces, and an actuator for moving a head carrier arm that supports transducer (read/write) heads, radially across the data disks to write data to or read data from concentric data tracks on the data disk.

In the manufacturing of the disk drive, many components with high electrical sensitivities are fabricated and manufactured. Devices such as the heads, sliders, etc., have electrical sensitivities to electromagnetic interferences or electrostatic discharge that requires the manufacturing environment worker to exercise great caution in the manufacturing of these components. Components such as suspensions comprise of conductive materials which tend to have conductive traces that are typically supported by insulative materials to help reduce the potential for electrostatic discharge or electromagnetic interference. When the suspension or similar components come into contact with each other.

Several manufacturing techniques have been adopted to reduce the amount of electrostatic discharge that occurs as the hard disk drive components are manufactured and assembled in the manufacturing environment. Some of these techniques include requiring assembly workers to wear electrostatic straps when they move the hard disk drive components about the manufacturing environment. The wrist strap is connected to a suitable ground point by means of a conducting cable. This way, a path is provided by which any static charge in the body of the wearer is conveyed to ground and thereby harmlessly dissipated. It is only necessary for the worker to wear a grounding strap on one wrist to enable him to safely handle electronic devices with either hand since the ground point serve to dissipate the charge from the entire body.

The problem with the use of wrist straps is that when a user is disconnected from the ground point as a result of the user being interrupted from their work and leaving the work-area, the user may or may not reconnect themselves upon return to the work-area. This is more so the case in a fast paced component assembly environment such as in a hard disk drive fabrication environment.

Some current solutions provide the use of wrist strap monitoring devices to monitor when the user is disconnected from ground. These monitors use localized alarm systems which only notify the user of their being disconnected from ground.

However, the problem with these current monitors is that the user tend to ignore or neglect the monitor alarms for several reasons including production downtime during the replacement of the wriststraps, production downtime during the replacement or repair of the monitor if the monitor itself is defective. Other problems may include damaged wriststrap jacks or terminals which may not alarm even when a user is detached from the monitor, wrong or improper connection by the user, and users forgetting to plug in their wrist straps.

Therefore, what is need is a flexible way of component fabrication and manufacturing that permits static charges to be controllably dissipated from the materials used in the construction of these components such that the potential damage from electrostatic discharge or electromagnetic interference to electric components connected to such components is reduced and an improved way of monitoring the wrist strap by providing a wider visibility of the alarm indicators to a larger group of operators in the assembly environment.

SUMMARY

In accordance with certain aspects of the present invention, there is provided a system and method for monitoring electromagnetic interference or electrostatic discharge and remotely displaying the status of monitoring straps coupled to operators working in the assembly environment in the fabrication and manufacture of hard disk drive components.

In one embodiment, an electrostatic discharge monitoring of the present invention provides a plurality of wrist-straps used by operators installing components during the manufacturing of hard disk drives in order to provide grounding to the operator as the operators handle electrically sensitive components and also to provide mobility to the operator within the assembly floor. In one embodiment, the wrist straps are monitored to detect the connection of and disconnection of the wrist straps from the monitoring unit. In one embodiment, the status of each wrist strap monitored is remotely displayed using a plurality of light emitting diodes that indicate when a particular wrist strap is connected or disconnected.

In one embodiment, the remote display unit include signal detection mechanism to detect when wrist straps are not connected to the monitoring unit in order to place the monitoring unit in a standby mode. The display unit is placed in a location beyond the sight of an operator in the assembly floor in order to make the display unit visible to a large number of operator within the assembly floor in order to provide the capability of remote monitoring of each wrist strap connected to the monitoring unit.

BRIEF DESCRIPTION OF THE DRAWINGS

The accompanying drawings, which are incorporated in and constitute a part of the specification, illustrate embodiments of the invention, and together with the general description given above and the detailed description given below serve to explain the teachings of the invention.

BEST MODES FOR CARRYING OUT THE INVENTION

Reference will now be made in detail to the alternative embodiment(s) of the present invention. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

The discussion will begin with an overview of a hard disk drive and components connected therewith. The discussion will then focus on embodiments of a method and system for limiting electrostatic discharge or electromagnetic interference during the manufacturing of the hard disk drive in a disk drive assembly environment by providing a remote alarm monitoring system to detect when operators are disconnected from a wrist strap monitoring device during the manufacturing of the hard disk drive.

Overview

In general, the HDD comb (also referred to as an E-block) serves as a platform on which the suspensions (compliant members containing sliders with recording heads) are mounted. The recording heads fly at a constant height (on the order of nanometers) above the disk surface tracking pre-written servo information. An HDD carriage assembly (as shown in FIG. 1) forms the primary motive mechanical system that enables a disk-drive to randomly access data to be written or recorded on the disk surfaces.

Figure 1:
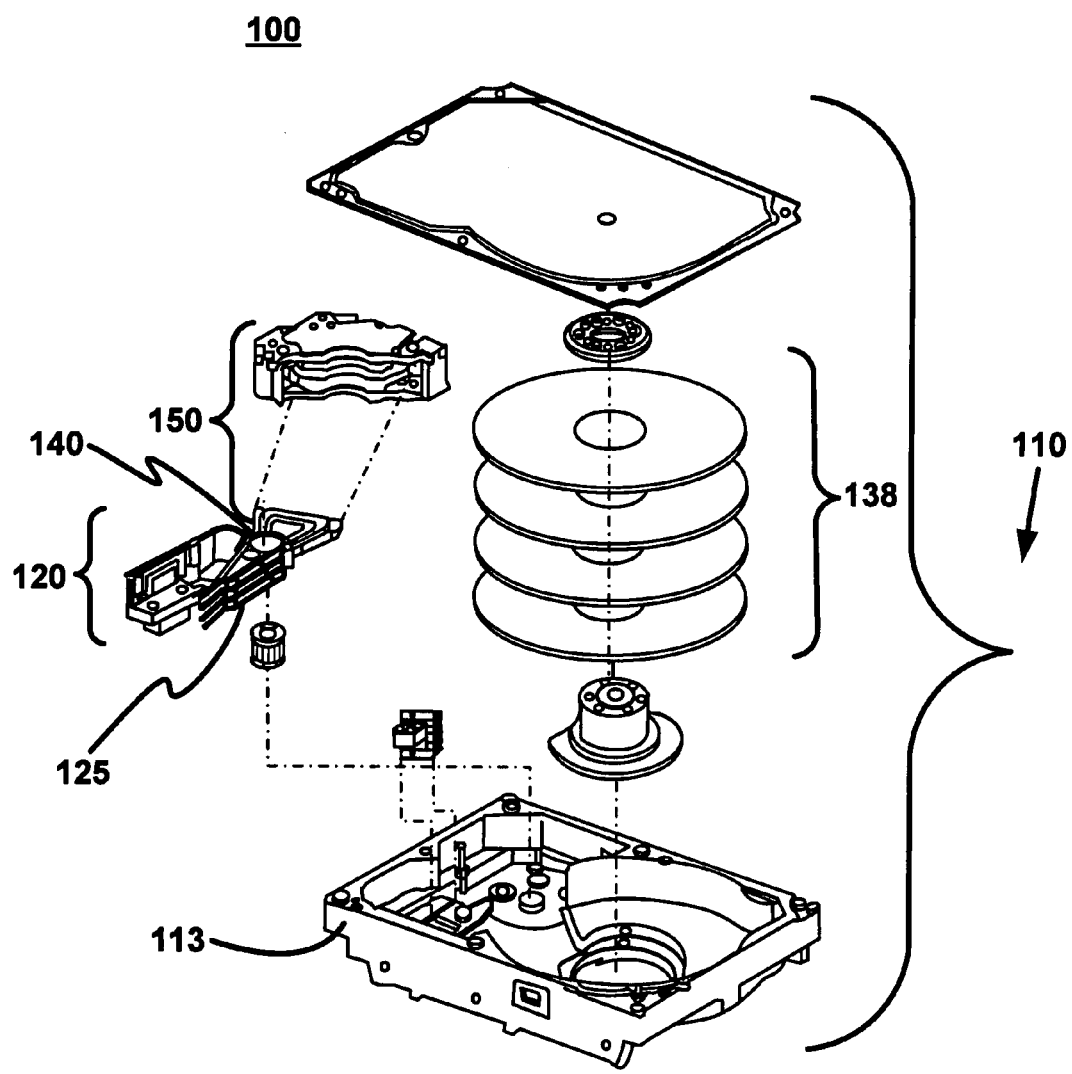
FIG. 1 is a plan view of an HDD in accordance with one embodiment of the present invention.

With reference now to FIG. 1 a schematic drawing of one embodiment of an information storage system including a magnetic hard disk file or drive 110 for a computer system is shown. Hard disk drive 110 has an outer housing or base 113 containing a disk pack having at least one media or magnetic disk 138. The disk pack (as represented by disk 138) defines an axis of rotation and a radial direction relative to the axis in which the disk pack is rotatable.

A spindle motor assembly having a central drive hub 140 operates as this axis and rotates the disk 138 or disks of the disk pack in the radial direction relative to housing 113. An actuator 120 includes a plurality of parallel actuator arms 125 in the form of a comb that is movably or pivotally mounted to base/housing 113 about a pivot assembly 140. A controller 150 is also mounted to base 113 for selectively moving the comb of arms relative to the disk pack (as represented by disk 138).

Figure 2:
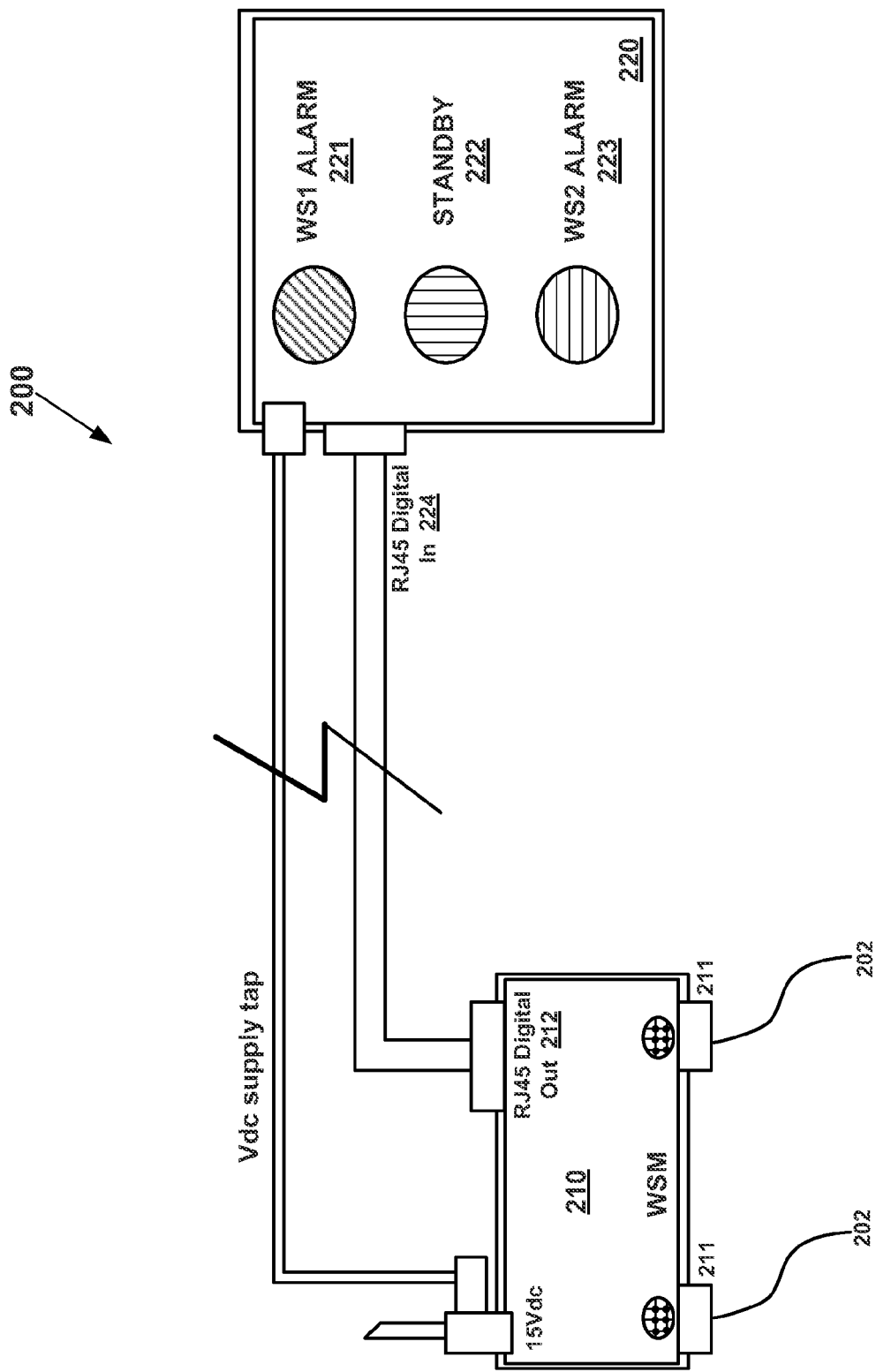
FIG. 2 is a block diagram illustration of one embodiment of the electrostatic discharge monitoring system of the present invention.

With reference now to FIG. 2 an exemplary block diagram of an electrostatic discharge monitoring system of one embodiment of the present invention is shown. As depicted in FIG. 2, the electrostatic discharge monitoring system 200 comprises a wrist-strap monitoring unit (WSM) 210 and a remote alarm panel display unit 220. In one embodiment, the WSM 210 comprises a plurality of connection junctions 211 for coupling electrostatic discharge wrist-straps 202 that may be connected to an operator assembling electronic components of the hard disk drive of the present invention. The WSM 210 further comprises a network connection source 212 that enables the WSM 210 to be coupled to a networking environment. In one embodiment, the WSM 210 may be connected to the remote alarm panel display unit 220 via a landline network connection such as an Ethernet connection. In another embodiment, the WSM 210 may be wirelessly connected to the remote alarm display panel unit 220 via the network connection source 212.

The remote alarm display panel unit 220 comprises a plurality of illuminating indicators 221-223 which are correspondingly illuminated to indicate the status of the wrist straps 212 coupled to the WSM 210 at any given time. In one embodiment of the present invention, the remote alarm panel display unit 220 is located in the manufacturing floor beyond a line of sight of the operators connected to the WSM 210 in order to provide a broad view of the remote alarm panel display unit 220 in the assembly floor. The alarm illuminating indicators 221-223 are not only visible to a particular operator connected to the WSM 210, but also to other personnel in the work-area such as line-leaders, supervisors, engineers, etc.

In one embodiment, the alarm illuminating indicators 221-223 include a first alarm indicator 221 that is correspondingly activated or deactivated in response to the alarming status of the first wrist strap (WS1). A second alarm indicator 222 is activated when wrist-straps are disconnected from the WSM 210 placing the remote alarm panel display unit 220 in standby mode and deactivated when wrist-straps are connected to the WSM 210 taking the remote alarm panel display unit 220 off standby mode.

A third alarm indicator 223 is activated when a second wrist strap (WS2) connected to the WSM 210 alarms and deactivated when WS2 is not alarming.

The remote alarm panel display unit 220 also includes a network connection unit 224 that enables the remote alarm panel display unit 220 to be networked via either an Ethernet connection or a wireless network connection to the WSM 210.

Figure 3:
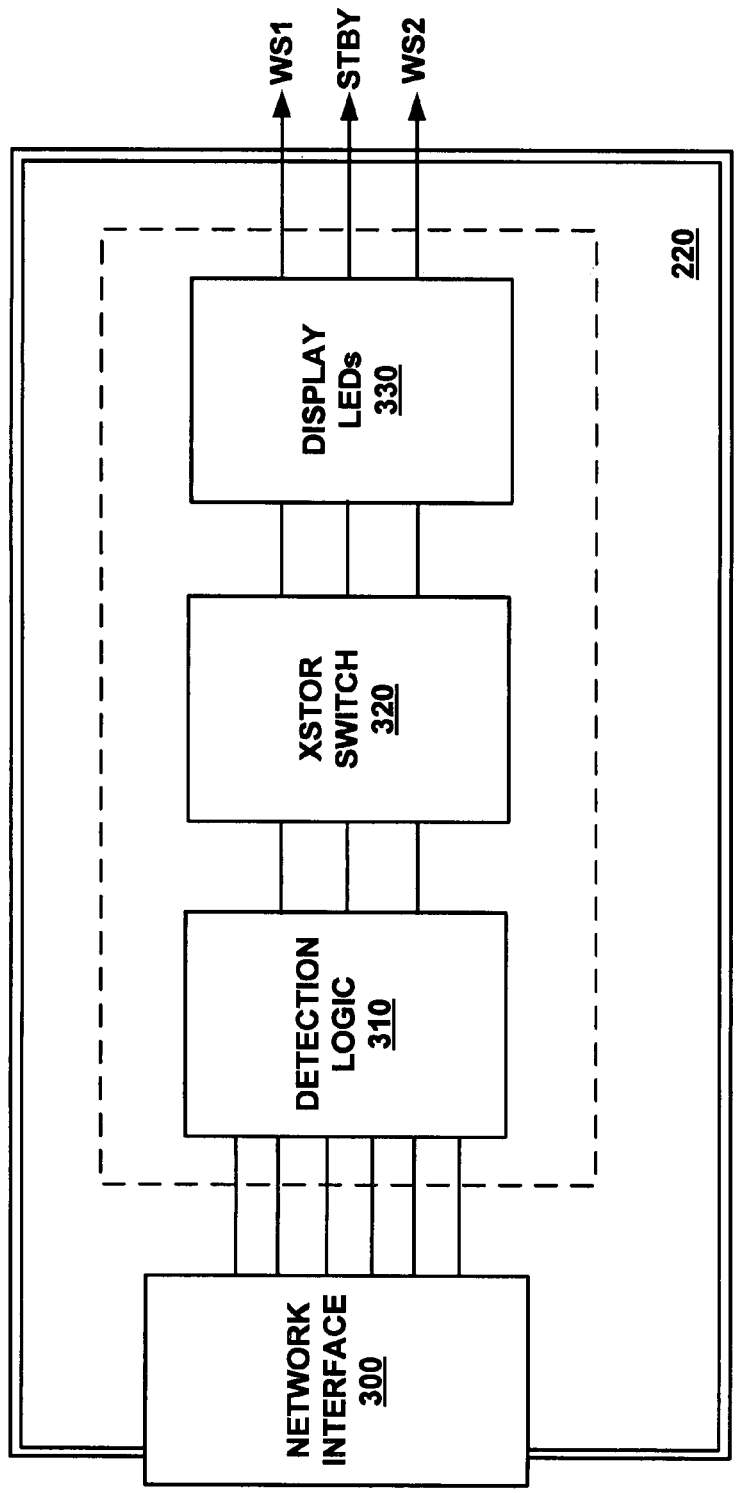
FIG. 3 is a block diagram illustration of the remote alarm panel display unit according to one embodiment of the invention.

FIG. 3 is a block diagram illustration of one embodiment of the remote alarm panel display unit 220 of one embodiment of the present invention. In the exemplary embodiment shown in FIG. 3, the remote alarm panel display unit 220 comprises a network connection module 300, detection logic circuit 310, amplifying switch 320 and indicator module 330. The network connection module 300 includes a plurality of connection pins that allows the remote alarm panel display unit 220 to be connected to the WSM 210. In one embodiment, the network connection module 300 is a RJ45 connector.

The detection logic circuit 310 includes a detection mechanism to detect the disconnection of a wrist-strap from the WSM 210 and a connection/reconnection of a wrist strap to the WSM 210. The logic circuit 310 also includes a notification logic that illuminates the alarm indicators in the panel display unit 220 when wrist-straps connected to the WSM 210 or disconnected from the WSM 210 alarm. The notification logic also illuminates a standby notification to the amplifying switch 320.

The amplifying switch 320 amplifies the notification signals from the network connection logic module 300 to illuminate the alarm illuminators 330 in the panel display unit 220.

Figure 4:
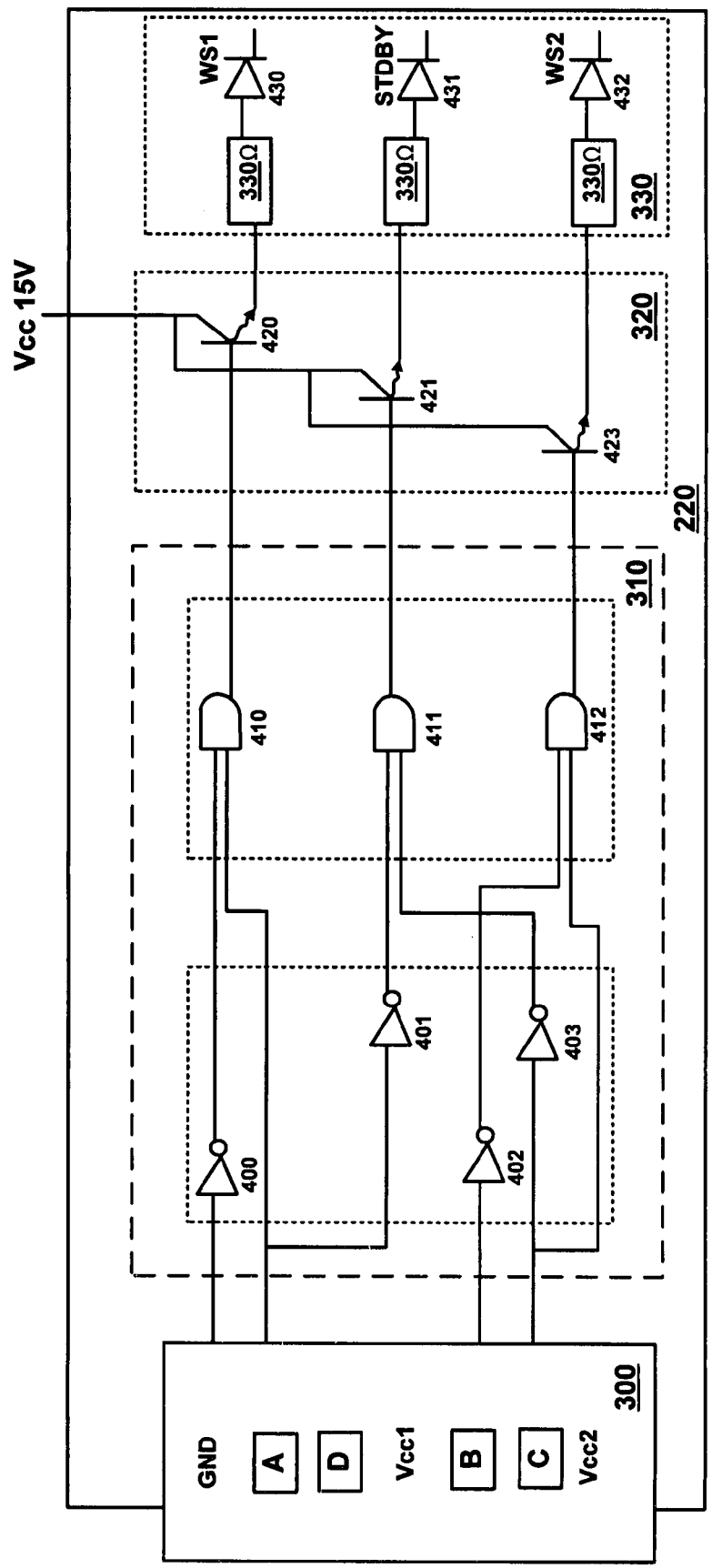
FIG. 4 is a block diagram illustration of the component circuitry of the remote alarm panel display unit of one embodiment of the invention.

FIG. 4 illustrates one embodiment of the internal circuitry components of one embodiment of the remote alarm panel display unit 220. As shown in FIG. 4, the logic circuit module 310 comprises a plurality of amplifier circuits 400-403 and AND gates 410-412. The switch module 320 comprises transistors 420-422 and voltage supply source 414. And the alarm illuminator 330 comprise light emitting sources 430-432.

In one embodiment of the present invention, incoming signals from a wrist strap connection to or disconnection from the WSM 210 is received by the digital input connection 300. The incoming signals are amplified by circuits 401-403. The outputs of circuits 401-403 are presented to AND gates 410-412 respectively. In one embodiment of the present invention, AND gate 410 outputs "High" if the corresponding wrist-strap alarms. Similarly, AND gate 412 outputs "High" if the corresponding wrist strap alarms. AND gate 411 outputs "High" if there are no wrist straps connected to the WSM 210 and the WSM 210 goes into standby mode.

The outputs signals from AND gates 410-412 are amplified by switch module 310 which comprises transistors 420-422. Power supply source 423 provides the transistors 420-422 module power to illuminate the alarm indicators in the light module 430. In one embodiment of the present invention, the power supply source 423 provides about 15 volts to the transistors 420-422. The transistors 420-422 correspondingly illuminate the light emitting diodes 430-432 in the light module 330 according to the status of the wrist straps being monitored.

Figure 5:
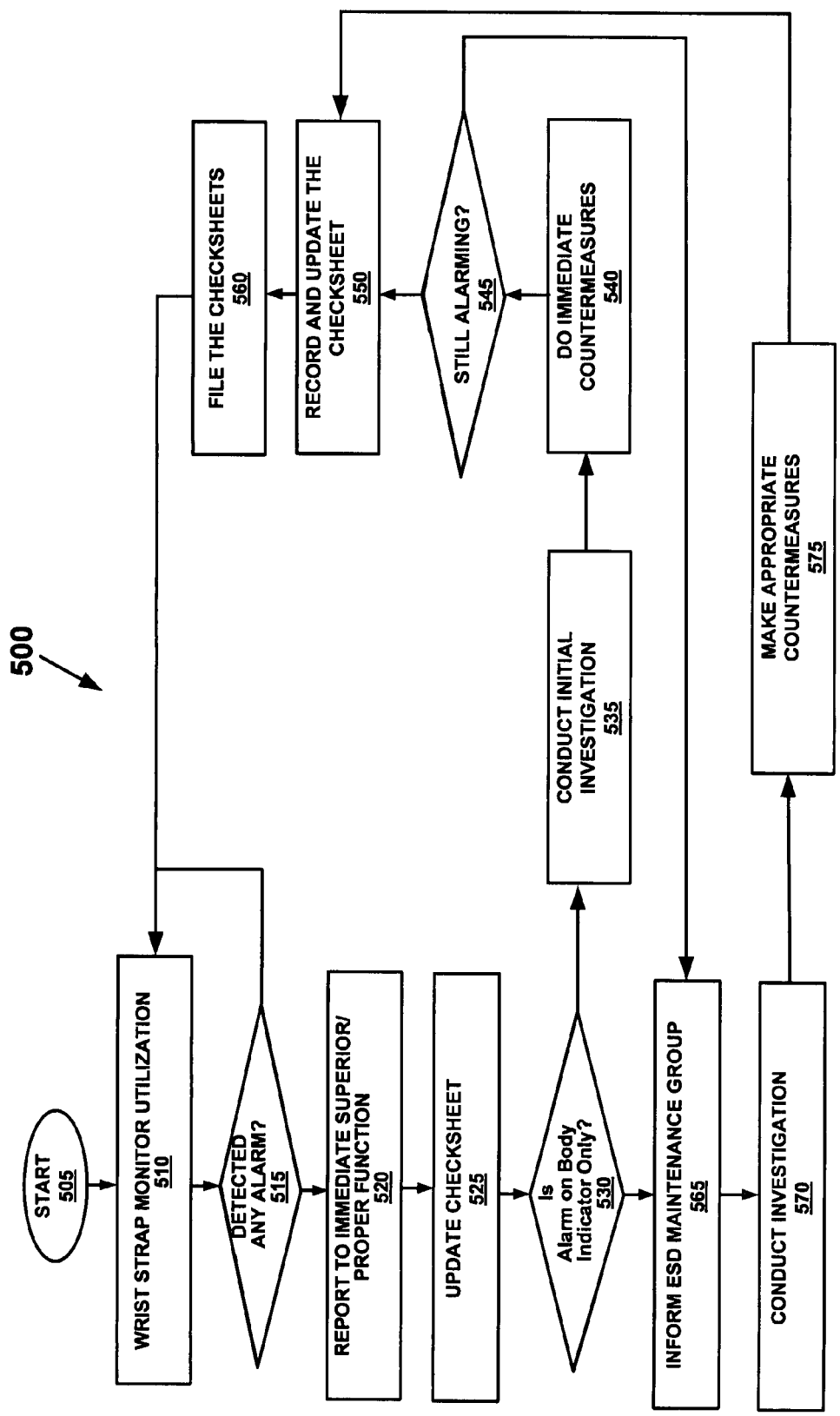
FIG. 5 is a flow diagram illustration of the electrostatic discharge monitoring system of one embodiment of the invention with a grounding cord.

Referring now to FIG. 5, an exemplary flow diagram of one embodiment of the electrostatic discharge monitoring system of the present invention is illustrated. AS shown in FIG. 5, the electrostatic discharge monitoring of the present invention starts 505 with the utilization of the wrist strap monitor 510. If the monitoring system 500 detects 515 any alarms due to either the disconnection, connection or the standby status of wrist straps coupled to the monitoring system, the alarm is reported 520 for the appropriate countermeasures to be undertaken.

After the appropriate countermeasures have been undertaken as a result of the detection of an alarm, the system checksheet is updated 525. After the system checksheet is updated 525, the system determines whether the detected alarm was due to a body voltage indicator only 530 or some other electrostatic discharge failure.

If the detected alarm is due to a body voltage, the initial countermeasure will be to conduct an initial investigation 535 to implement the appropriate countermeasure 540. After the appropriate countermeasure is implemented after the detection of an alarm, a determination is made to see if the system is still alarming 540. If the system is still alarming after implementing a countermeasure, the electrostatic discharge maintenance group is notified 565.

If after implementing the countermeasure, the system is not alarming, the system checksheet is updated and recorded with the alarming event 550. After recording a particular alarm event, the system checksheets are filed 560 by the operator of the line-manager.

After the electrostatic discharge maintenance group if informed of an on-going alarm event 565, the ESD team conducts further investigation 570 to determine the source and cause of the alarm. The ESD team takes the appropriate countermeasure during its investigation if the source and cause of an on-going alarm and records its findings after the problem is resolved.

Example embodiments of the present technology are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A electrostatic monitoring system, comprising:
    a plurality of electrostatic wrist-straps;
    a wrist-strap monitoring unit; and
    a remote alarm display unit for receiving disconnection signals of the electrostatic wrist-strap from the wrist-strap monitoring unit and displaying corresponding alarm signals to indicate the status of the plurality of electrostatic wrist-straps, the remote alarm display unit comprising:
        a first alarm notification Light Emitting Diodes to indicate a status when a first wrist strap alarms;
        a second alarm notification Light Emitting Diode to indicate a status when a second wrist strap alarms; and
        a third alarm notification Light Emitting Diode activated to indicate a status when said plurality of electrostatic wrist-straps are disconnected from said wrist-strap monitoring unit and the wrist strap monitoring unit is in standby mode.

2. The electrostatic monitoring system of claim 1, wherein the wrist-strap monitoring unit comprises a plurality of connecting junctions for coupling the plurality of electrostatic wrist-straps.

3. The electrostatic monitoring system of claim 1, wherein the wrist-strap monitoring unit further comprises a network connection for remotely coupling the remote alarm display unit to the wrist-strap monitoring unit.

4. The electrostatic monitoring system of claim 1, wherein the remote alarm display unit is located within a manufacturing assembly work-area remotely visible to all operators remotely coupled to the alarm display unit via a remote wrist-strap monitoring unit.

5. The electrostatic monitoring system of claim 1, wherein the remote alarm display unit is positioned beyond the line of sight of the operators coupled to the wrist strap monitoring unit in an assembly environment in order to enable remote monitoring of the plurality of electrostatic wrist-straps.

6. The electrostatic monitoring system of claim 1, wherein the plurality of electrostatic wrist-straps are made of an anti-electrostatic discharge material.

7. A electrostatic discharge monitoring system, comprising:
    a wrist strap monitoring unit having a plurality of connection junctions for coupling a plurality of electrostatic discharge prevention wrist straps; and
    a remote alarm panel display unit coupled to the wrist strap monitoring unit for providing a remote status indicator of the status of the plurality of wrist straps coupled to the wrist strap monitoring unit, the remote alarm display unit comprising:
        a first alarm notification Light Emitting Diodes to indicate a status when a first electrostatic discharge prevention wrist strap alarms;
        a second alarm notification Light Emitting Diode to indicate a status when a second electrostatic discharge prevention wrist strap alarms; and
        a third alarm notification Light Emitting Diode to activated to indicate a status when said plurality of electrostatic discharge prevention wrist straps are disconnected from said wrist-strap monitoring unit and the wrist strap monitoring unit is in standby mode.

8. The electrostatic discharge monitoring system of claim 7, wherein the wrist strap monitoring unit comprises a network connection interface to enable the wrist strap monitoring unit to be coupled to the remote alarm panel display unit.

9. The electrostatic discharge monitoring system of claim 7, wherein the wrist strap monitoring unit is wirelessly coupled to the remote alarm panel display unit.

* * * * *